United States Patent [19]

Sugimoto

[11] Patent Number: 4,636,659
[45] Date of Patent: Jan. 13, 1987

[54] SAMPLE AND HOLD CIRCUIT

[75] Inventor: Yasuhiro Sugimoto, Yokohama, Japan

[73] Assignee: Kabushiki Kaisha Toshiba, Kawasaki, Japan

[21] Appl. No.: 668,841

[22] Filed: Nov. 6, 1984

[30] Foreign Application Priority Data

Nov. 11, 1983 [JP]  Japan ................. 58-211879

[51] Int. Cl.$^4$ .................. H03K 17/04; G11C 27/02
[52] U.S. Cl. .................................. 307/353; 328/151
[58] Field of Search .............. 307/352, 353; 328/151

[56] References Cited
FOREIGN PATENT DOCUMENTS 185096  10/1983  Japan .................................. 307/353

OTHER PUBLICATIONS

Tsuken, "Kenkyu Jitsuyoka Hohkoku (Research and Practical Reduction Report)," vol. 29, No. 3, pp. 399-413, 1980.

*Primary Examiner*—John Zazworsky
*Attorney, Agent, or Firm*—Finnegan, Henderson, Farabow, Garrett & Dunner

[57]  ABSTRACT

The sample and hold circuit includes a capacitor and first NPN and PNP transistors for respectively controlling the charge and discharge of the capacitor. The first NPN and PNP transistors are fed with base currents from the second PNP and NPN transistors. The sample and hold circuit further includes a driving controller. The driving controller periodically bypasses the base currents of the first NPN and PNP transistors.

6 Claims, 5 Drawing Figures

SAMPLE AND HOLD CIRCUIT

BACKGROUND OF THE INVENTION

This invention relates to a sample and hold circuit for sampling a high frequency signal, for example, a video signal.

Pulse code modulation (PCM) is now primarily used for the transmission of the video signal. In the PCM transmission, the video signal is sampled, quantitized, and coded. To sample a signal such as a video signal at high frequencies, a high speed sample and hold circuit is required.

FIG. 1 shows a conventional high speed sample and hold circuit. The sample and hold circuit is provided with a capacitor 10 and a bridge circuit 12 for charging and discharging the capacitor 10. The bridge circuit 12 contains NPN transistors Q1 to Q4 of which the bases are connected to the collectors, respectively. A signal source 14 is connected to a junction of the emitter of the transistor Q1 and the collector of the transistor Q2. A junction between the emitter of the transistor Q3 and the collector of the transistor Q4 is connected to the capacitor 10. A constant voltage supply 16 is connected through a constant current source 18 to the collectors of the transistors Q1 and Q3. The emitters of the transistors Q2 and Q4 are grounded through the constant current source 20. The sample and hold circuit includes a pulse generator 22 for periodically generating first and second control pulses from first and second control terminals, and further includes NPN transistors Q5 and Q6. The first control pulse has an inverted relation to the second control pulse. The voltage at the first control terminal changes from a low to high level when the voltage at the second control terminal changes from high to low. The bases of the NPN transistors Q5 and Q6 are connected to the respective collectors of these transistors. With such a connection, those transistors serve as diodes. The first terminal of the pulse generator 22 is connected to the emitter of the NPN transistor Q5. The collector of the NPN transistor Q5 is connected to the collectors of the NPN transistors Q1 and Q3. The second control terminal of the pulse generator 22 is connected to the collector of the NPN transistor Q6. The emitter of the NPN transistor Q6 is connected to the emitters of the NPN transistors Q2 and Q4.

In this sample and hold circuit, when the level of the voltages V1 and V2 at the first and second control terminals of the pulse generator 22 are low and high, respectively, the voltage of the input signal is held. When the voltages V1 and V2 are high and low, respectively, the input signal voltage is sampled.

When the sample and hold circuit is in a holding mode, for example, a constant current I1 derived from a constant current circuit 18 flows into the first control terminal of the pulse generator 22 through the NPN transistor Q5. On the other hand, a constant current I2 is fed from the second control terminal of the pulse generator 22 into a constant current source 20. At this time, the transistors Q3 and Q4 are nonconductive. Accordingly, the voltage across the capacitor 10 is kept constant without regard to the input signal VIN.

A relationship between the input signal VIN and the output signal VOUT will be described referring to FIG. 2. The output signal VOUT corresponds to the voltage VC1 across the capacitor 10. In FIG. 2, VX designates a voltage difference between the input signal VIN and the output signal VOUT. In FIG. 2, the voltages V1 and V2 at the first and second terminals of the pulse generator 22 are inverted at time To. When the voltage V1 increases above the voltage VC1 across the capacitor 10 and, moreover, the voltage V2 drops below the input signal VIN, the transistors Q5 and Q6 prohibit the current from flowing through the transistors per se. As a result, the constant current I1 from the constant current source 18 flows through the NPN transistor Q3. At the same time, the constant current I2 is supplied from the signal source 14 to the constant current source 20 through the NPN transistor Q2. At this time, no current flows into the transistors Q1 and Q4. Therefore, the capacitor 10 is charged by the constant current I1 irrespective of the input signal VIN, i.e., voltage from the signal source 14. Through this charging, the voltage across the capacitor 10 increases at a fixed rate.

The voltage difference VX becomes smaller than a predetermined threshold voltage Vφ of the bridge circuit 12 at time T2. At this time, the transistors Q1 and Q4 are both conductive, and the capacitor 10 is charged by a nonlinearly changing current. A change of current corresponds to a time constant as determined by the capacitance of the capacitor 10 and the impedance of the bridge circuit 12. In FIG. 2, TC1 designates a charge/discharge time by the constant current; TC2, a charge/discharge time by the current as defined by the time-constant.

As described above, the two types of modes are present in the charge/discharge of the capacitor 10. For this reason, the conventional sample and hold circuit is unsatisfactory in reliability when it operates in a high speed operation. Specifically, in the sample and hold circuit, when an amplitude of the input signal VIN is large, the constant currents I1 and I2 must be set at large values. Otherwise, it takes a long time for the output signal VOUT to reach the input signal. As a result, the response characteristic is poor. In this condition, it is very difficult to sample a signal such as the video signal in the high frequency band.

SUMMARY OF THE INVENTION

Accordingly, an object of the present invention is to provide a sample and hold circuit operable at a high speed with high reliability.

According to the present invention, there is provided a sample and hold circuit comprising: input and output terminals; first and second power source terminals; a capacitor connected between the output terminal and the second power source terminal; first and second transistors in a complementary relationship, the current path of the first transistor being connected between the first power source terminal and the output terminal, and the current path of the second transistor being connected between the output terminal and the second power source terminal; a driving circuit for supplying base currents to the first and second transistors in accordance with the difference between the voltages of the input and output terminals; and a driving control circuit including a mode setting section for selectively setting sampling and holding modes and a current control section for interrupting the base currents of the first and second transistors in the holding mode and permitting the base currents of the first and second transistors to flow in the sampling mode.

According to the present invention, the charge and discharge currents are not limited to a fixed value, but change in accordance with a time constant specified by the impedance of the current path and the capacitance of the capacitor. Therefore, the sample and hold circuit is operable at a high speed with satisfactory reliability. Thus, according to the present invention, it is possible to sample a high frequency signal such as a video signal.

DETAILED DESCRIPTION OF THE PREFERRED EMBODIMENT

Figure 1:
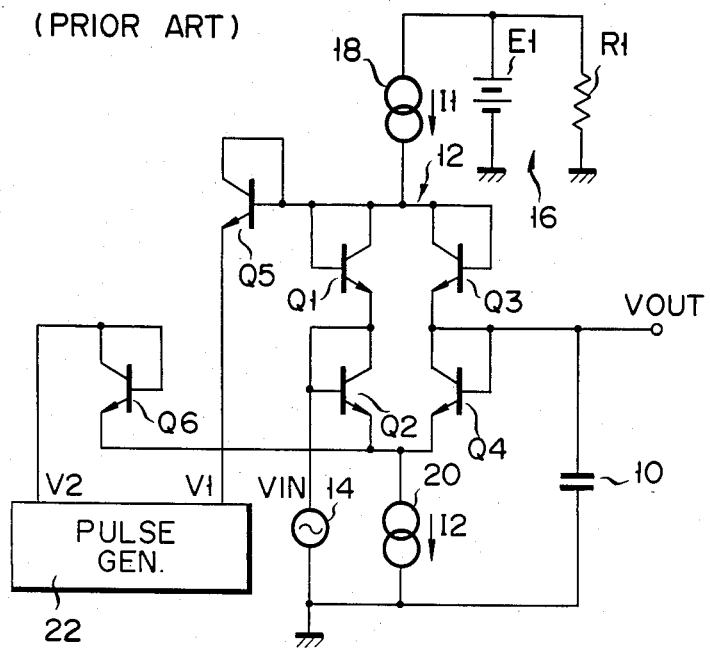
FIG. 1 is a circuit diagram of a conventional sample and hold circuit.
Figure 2:
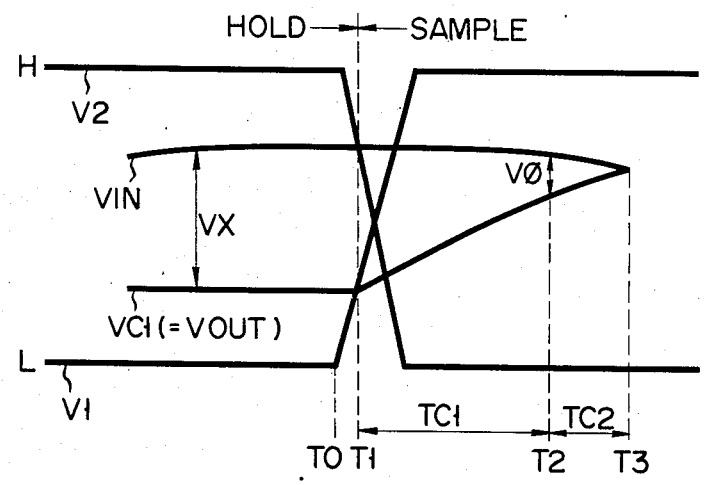
FIG. 2 is a graph for illustrating the operation of the sample and hold circuit of FIG. 1.
Figure 3:
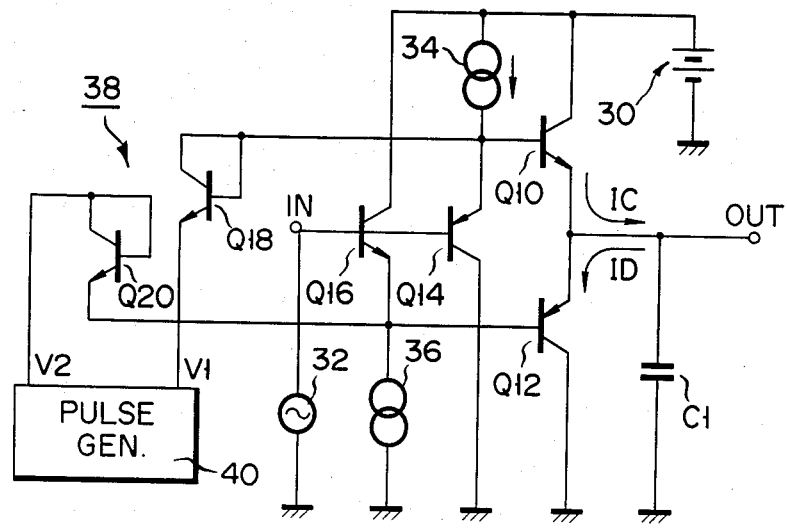
FIG. 3 is a circuit diagram of a sample and hold circuit which is an embodiment of the present invention.

An embodiment of a sample and hold circuit according to the present invention will be described referring to FIGS. 3 to 5. The sample and hold circuit contains a capacitor C1 and NPN and PNP transistors Q10 and Q12 for controlling the charge and discharge of the capacitor C1. The capacitor C1 is connected between the output terminal OUT and ground. The output terminal OUT is connected to the emitters of the transistors Q10 and Q12. The collector of the NPN Q10 is connected to a constant voltage supply 30, and the collector of the PNP transistor Q12 is grounded. The sample and hold circuit contains PNP and NPN transistors Q14 and Q16 for driving the transistors Q10 and Q12 according to the voltage of a signal source 32. The emitter of the PNP transistor Q14 is connected to a constant voltage supply 30 through a constant current source 34, and a base of the NPN transistor Q10. The collector of the PNP transistor Q14 is grounded. The emitter of the NPN transistor Q16 is also grounded through a constant current source 36 and connected to the base of the PNP transistor Q12. The collector of the NPN transistor Q16 is connected to the constant voltage supply 30. The voltage of the signal source 32 is supplied to the bases of the PNP and NPN transistors Q14 and Q16. The sample and hold circuit includes a drive controller 38 to provide a bypath for the drive currents of the transistors Q10 and Q12. The drive controller 38 includes a pulse generator 40 for generating first and second control pulses at the first and second output ends and, additionally, NPN transistors Q18 and Q20 serving as diodes. The first and second control pulses are related with each other in an inverted fashion and are periodically generated to sample a voltage of the signal source 32. The emitter of the PNP transistor Q14 is connected to the base and the collector of the NPN transistor Q18. The emitter of the NPN transistor Q18 is connected to the first output end of the pulse generator 40. The second output end of the pulse generator 40 is connected to the base and the collector of the NPN transistor Q20, and the emitter of the NPN transistor Q20 is connected to the emitter of the NPN transistor Q16.

The operation of the sample and hold circuit thus arranged will be described. For example, during the period that the pulse generator 40 does not produce the first and second control pulses, the voltages V1 and V2 at the first and second output ends of the pulse generator 40 are at ground level (e.g. 0 V) and high level (e.g., 5 V), respectively. At this time, the constant current I1 from the constant current source 34 barely flows through the PNP transistor Q14, but flows mostly through the PNP transistor Q18. The constant current I2 from the constant current source 36 barely flows through the NPN transistor Q16, but flows mostly through the NPN transistor Q20. Therefore, the base currents are not fed to the NPN and PNP transistors Q10 and Q12, so that these transistors Q10 and Q12 are both kept nonconductive. Accordingly, the capacitor C1 is neither charged nor discharged, so that the voltage across the capacitor C1 is kept constant.

When the pulse generator 40 generates first and second control pulses, the voltages V1 and V2 at the first and second output ends are set at high level and ground level, respectively. At this time, the constant current I1 from the constant current source 34 barely flows through the NPN transistor Q18, but flows mostly through the PNP transistor Q14. The constant current I2 from the constant current source 36 barely flows through the NPN transistor Q20, but flows mostly through the NPN transistor Q16. Predetermined base currents are fed as bias currents to the NPN transistors Q10 and Q12.

When the voltage VC1 across the capacitor C1 is lower than the voltage VI of the signal source 32, voltage is generated across the base-emitter path of the NPN transistor Q10. Then, the charge current IC flows from the constant voltage supply 30 into the capacitor C1, via the NPN transistor Q10, till the emitter voltage of NPN transistor Q10 is equal to the base voltage of the PNP transistor Q14, i.e., the output voltage of the signal source 32. Since little resistance is present in the path of the charge current IC, the charging speed of the capacitor C1 is very high. When the voltage VC1 across the capacitor C1 is higher than the voltage VI, voltage is generated between the base and emitter of the PNP transistor Q12. Then, the discharge current ID flows from the capacitor C1 to ground via the PNP transistor Q12, till the voltage VC1 across the capacitor C1 is equal to the output voltage of the signal source 32. Since little resistance is present in the path of the discharge current ID, the discharge speed of the capacitor C1 is also very high. In the sample and hold circuit, the charge/discharge current flows not through a constant current source. Therefore, it is not kept at a constant value and changes depending on time. The changing rate of the charge/discharge and current depend on a time constant determined by the capacitance of the capacitor C1 and the impedance of parallel connection of the emitters of the NPN and PNP transistors Q10 and Q12 (e.g., ½ × emitter impedance of NPN transistor). In this embodiment, the NPN and PNP transistors Q10 and Q12 are complementarily coupled with each other to self-feed back the voltage of the output terminal OUT.

Figure 4:
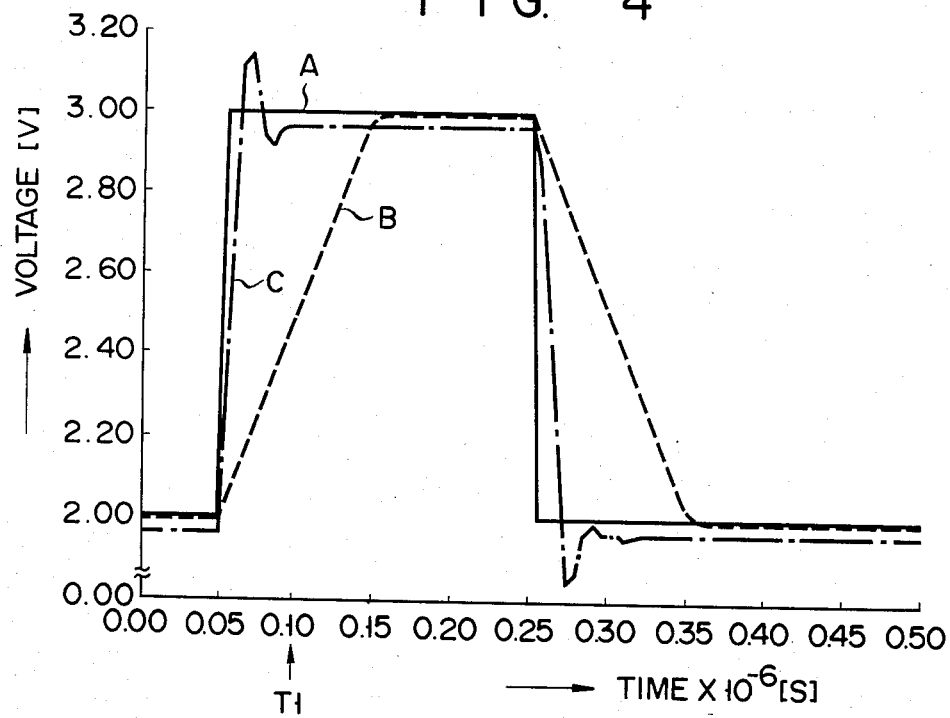
FIG. 4 is a graph illustrating a charge/discharge characteristic of the capacitor when the sample and hold circuit is in a sampling mode.
Figure 5:
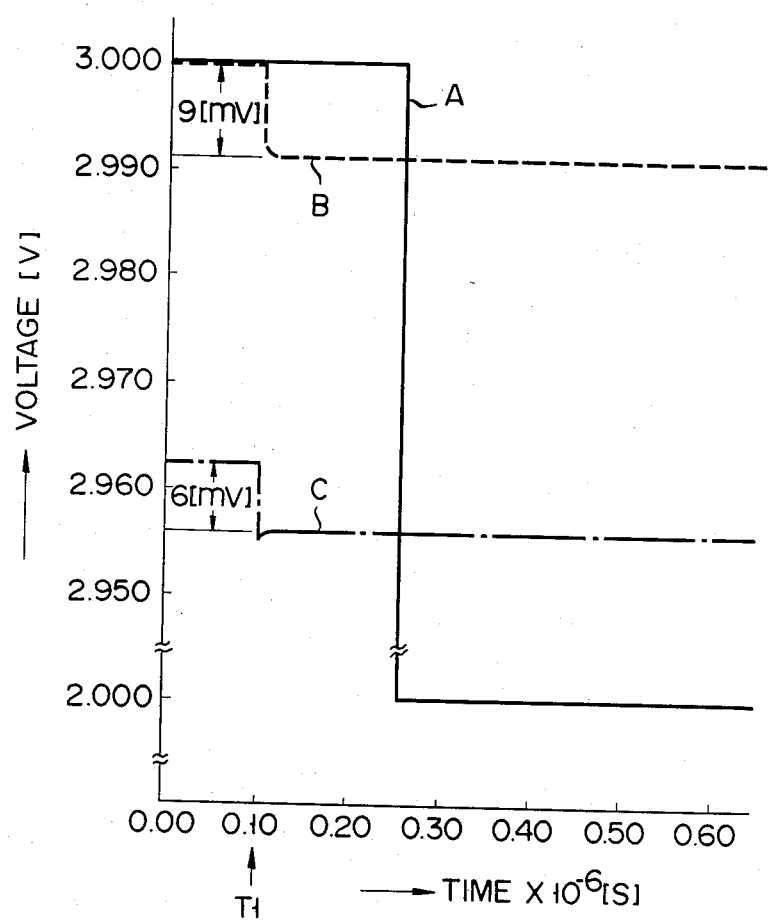
FIG. 5 shows a charge/discharge characteristic of the output capacitor when the sample and hold circuit of FIG. 3 is in a holding operation.

The result of a SPICE simulation of the present embodiment will be comparatively described to conventional embodiments, referring to FIGS. 4 and 5. In this circuit, the constant current I1=I2=1 mA, the power supply voltage VE=5 V, and the capacitance C1=100 pF. In the figure, symbol A designates a voltage variation of the input signal; B, a variation of an output signal of a conventional sample and hold circuit; and C, a variation of an output signal of the present embodiment.

FIG. 4 shows a charge/discharge characteristic of the capacitor C1 when the sample and hold circuit operates in a sampling mode. During measurement of this characteristic, the NPN transistors Q18 and Q20 were kept in an off state. As seen from the figure, the conventional sample and hold circuit needs 100 ns till it produces an output signal in response to the input signal. In the sample and hold circuit according to the present invention, a much shorter period of time is required than the 100 ns. The output signal of the sample and hold circuit follows a transition of the input signal with satisfactory accuracy.

FIG. 5 illustrates a charge and discharge characteristic of the capacitor C1 when the sample and hold circuit operates in a holding mode. For the measurement of this characteristic, the NPN transistors Q10 and Q12 were switched to an ON state at time T1. In the conventional sample and hold circuit, the voltage of the output signal drops to approximately 9 mV through this switching. On the other hand, in the present embodiment, the voltage of the output signal drops only 6 mV. The response speed of this embodiment is higher than the conventional one.

As seen from the foregoing description, in this embodiment, the charge/discharge current of the capacitor C1 changes along a characteristic curve, determined by a time constant, without being limited to a specific value. In the sample and hold circuit, the time constant is smaller than that of the conventional one. The output signal of the circuit, when it is accurately operating in a sampling mode, follows a change of the input signal. In this respect, the sample and hold circuit operates with high reliability. Accordingly, the sample and hold circuit is suitable for the sampling of the high frequency signal such as the video signal. In this case, the pulse generator is set so as to generate first and second control pulses at high frequencies.

According to the present invention, a high frequency input signal can be sampled at a high speed, and the output signal accurately corresponds to the input signal.

What is claimed is:

1. A sample and hold circuit comprising:
    input and output terminals;
    first and second power source terminals;
    capacitive means connected between said output terminal and said second power source terminal;
    a first transistor of one conductivity type which has a collector connected to said first power source terminal and an emitter connected to said output terminal;
    a second transistor of the opposite conductivity type which has an emitter connected to said output terminal and a collector connected to said second power source terminal;
    a third transistor of the opposite conductivity type which has a base connected to said input terminal, a collector connected to said second power source terminal and an emitter connected to a base of said first transistor;
    a fourth transistor of the one conductivity type which has a base connected to said input terminal, a collector connected to said first power source terminal and an emitter connected to a base of said second transistor;
    a first constant current source connected between said first power source terminal and the emitter of said third transistor;
    a second constant current source connected between said second power source terminal and the emitter of said fourth transistor; and
    a driving control circuit including mode setting means for selectively setting sampling and holding modes and current control means to inhibit flow of the respective base currents of said first and second transistors in the holding mode and to permit flow of the respective base currents of said first and second transistors in the sampling mode.

2. A sample and hold circuit according to claim 1, wherein said first and fourth transistors are NPN transistors, and said second and third transistors are PNP transistors.

3. A sample and hold circuit according to claim 2, wherein said mode setting means includes a voltage generating circuit which generates a first voltage at a high level and a second voltage at a low level from respective first and second control terminals during the sampling mode and generates the first voltage at a low level and the second voltage at a high level from the respective first and second control terminals during the holding mode.

4. A sample and hold circuit according to claim 3, wherein said current control means includes first switching means connected between said first control terminal and the base of said first transistor for permitting current to flow in a first direction from said first constant current source to said first control terminal in the holding mode and preventing the flow of current in the first direction in the sampling mode, and second switching means connected between said second control terminal and the base of said second transistor for permitting current to flow in a second direction from said second control terminal to said second constant current source in the holding mode and preventing the flow of current in the second direction in the sampling mode.

5. A sample and hold circuit according to claim 4, wherein said voltage generating circuit is a pulse generator in which said first and second voltages are simultaneously and periodically inverted in level to alternate sampling and holding modes.

6. A sample and hold circuit according to claim 5, wherein said first switching means is an NPN transistor having a collector connected to the base of said first transistor, an emitter connected to said first control terminal and a base connected to the collector thereof, and said second switching means is an NPN transistor having an emitter connected to the base of said second transistor, a collector connected to said second control terminal and a base connected to the collector thereof.

* * * * *